(12) United States Patent
Cheng et al.

(10) Patent No.: US 8,513,765 B2
(45) Date of Patent: Aug. 20, 2013

(54) FORMATION METHOD AND STRUCTURE FOR A WELL-CONTROLLED METALLIC SOURCE/DRAIN SEMICONDUCTOR DEVICE

(75) Inventors: Kangguo Cheng, Guilderland, NY (US); Bruce B. Doris, Brewster, NY (US); Ali Khakifirooz, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 12/838,844

(22) Filed: Jul. 19, 2010

(65) Prior Publication Data

US 2012/0012933 A1  Jan. 19, 2012

(51) Int. Cl.
   *H01L 21/02* (2006.01)
(52) U.S. Cl.
   USPC ........... 257/486; 438/233; 438/300; 438/153; 438/154; 438/576; 438/581; 438/583; 257/576; 257/E21.618; 257/E21.633; 257/E21.164; 257/E21.165; 257/E29.161; 257/E21.203
(58) Field of Classification Search
   USPC ........... 438/233, 300, 153, 154, 576, 581, 438/583; 257/486, 576, E21.618, E21.633, 257/E21.164, E21.165, E29.161, E21.203
   See application file for complete search history.

(56) References Cited

U.S. PATENT DOCUMENTS

| | | | |
|---|---|---|---|
| 4,696,093 A | 9/1987 | Welch | |
| 5,663,584 A | 9/1997 | Welch | |
| 6,495,882 B2 | 12/2002 | Snyder | |
| 6,566,198 B2 | 5/2003 | Park et al. | |
| 6,744,103 B2 | 6/2004 | Snyder | |
| 6,974,737 B2 | 12/2005 | Snyder et al. | |
| 7,052,945 B2 | 5/2006 | Snyder | |
| 7,081,655 B2 | 7/2006 | Maszara | |
| 7,221,019 B2 | 5/2007 | Snyder et al. | |
| 7,291,524 B2 | 11/2007 | Snyder et al. | |
| 7,306,998 B2 | 12/2007 | Maszara | |
| 7,432,579 B2 | 10/2008 | Matsudai et al. | |
| 7,504,328 B2 | 3/2009 | Zhu et al. | |
| 2003/0008444 A1 | 1/2003 | Snyder | |
| 2003/0139002 A1 | 7/2003 | Snyder | |
| 2003/0235936 A1 | 12/2003 | Snyder et al. | |
| 2004/0041226 A1 | 3/2004 | Snyder et al. | |
| 2005/0051815 A1 | 3/2005 | Snyder | |
| 2005/0098845 A1 | 5/2005 | Matsudai et al. | |
| 2005/0118793 A1 | 6/2005 | Snyder et al. | |
| 2005/0139860 A1 | 6/2005 | Snyder et al. | |
| 2005/0247926 A1* | 11/2005 | Sun et al. | 257/19 |
| 2005/0275033 A1 | 12/2005 | Zhu et al. | |
| 2005/0287730 A1 | 12/2005 | Snyder et al. | |
| 2006/0022293 A1* | 2/2006 | Welch | 257/476 |
| 2006/0237752 A1 | 10/2006 | Larson et al. | |
| 2006/0244052 A1 | 11/2006 | Snyder et al. | |
| 2007/0026590 A1 | 2/2007 | Snyder et al. | |

(Continued)

*Primary Examiner* — Julio J Maldonado
*Assistant Examiner* — Hajar Kolahdouzan
(74) *Attorney, Agent, or Firm* — Tutunjian & Bitetto, P.C.; Louis J. Percello

(57) ABSTRACT

A device and method for forming a semiconductor device include growing a raised semiconductor region on a channel layer adjacent to a gate structure. A space is formed between the raised semiconductor region and the gate structure. A metal layer is deposited on at least the raised semiconductor region. The raised semiconductor region is silicided to form a silicide into the channel layer which extends deeper into the channel layer at a position corresponding to the space.

16 Claims, 4 Drawing Sheets

(56) References Cited

U.S. PATENT DOCUMENTS

| | | |
|---|---|---|
| 2007/0187758 A1 | 8/2007 | Jun et al. |
| 2007/0194353 A1 | 8/2007 | Snyder |
| 2007/0267762 A1 * | 11/2007 | Yu et al. ............ 257/E29.148 |
| 2009/0163005 A1 | 6/2009 | Zhu et al. |
| 2009/0179281 A1 | 7/2009 | Zhu et al. |
| 2009/0273040 A1 | 11/2009 | Liang et al. |

* cited by examiner

FORMATION METHOD AND STRUCTURE FOR A WELL-CONTROLLED METALLIC SOURCE/DRAIN SEMICONDUCTOR DEVICE

BACKGROUND

1. Technical Field

The present invention relates to semiconductor devices and processing, and more particularly to formation methods and structure of a semiconductor device having a metallic source/drain region.

2. Description of the Related Art

Thin channel metal oxide semiconductor field effect transistors (MOSFETs), such as ultrathin body semiconductor-on-insulators (SOI), finFETS, etc., with conventional doped source/drains often suffer from short channel control issues. A Schottky barrier (SB) device with a thin semiconductor body (e.g., thin SOI or finFET) would be an attractive alternative for overcoming the drawbacks of conventional MOSFETs with doped source/drains to provide improved short-channel control. However, fabrication of Schottky barrier devices relies on depositing a metal species (e.g., Ni) and the metal species diffuses and reacts with adjacent semiconductor layers. This is a drawback especially during a formation of silicided source and drain regions. For a thin body SB device, a practical issue is the variation of a silicide layer as a function of the variation of a thin semiconductor layer. This adversely causes device variation (channel length, silicide pipe, etc.).

SUMMARY

A device and method for forming a semiconductor device include growing a raised semiconductor region on a channel layer adjacent to a gate structure. A space is formed between the raised semiconductor region and the gate structure. A metal layer is deposited on at least the raised semiconductor region. The raised semiconductor region is silicided to form a silicide into the channel layer which extends deeper into the channel layer at a position corresponding to the space.

Another method for forming a thin channel semiconductor device includes providing a semiconductor channel layer on an insulator; forming a gate structure having first spacers formed on sidewalls thereof; growing a raised semiconductor region on the channel layer adjacent to a gate structure in a source/drain region; forming a space between the raised semiconductor region and the gate structure; depositing a metal layer on at least the raised semiconductor region and within the space; and siliciding the raised semiconductor region to form a silicide into the channel layer which extends deeper into the channel layer at a position corresponding to the space, the silicide forming source/drain regions adjacent to the gate structure.

A semiconductor device includes a semiconductor substrate. A gate structure is formed on the substrate, and reservoir material is formed on the substrate. Silicided source and drain regions are formed adjacent to the gate structure. The silicided source and drain regions have a mounded shape as a result of siliciding the reservoir material wherein the siliciding is controlled such that the silicided regions do not connect below the gate structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
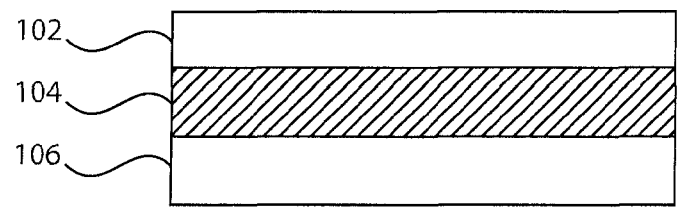
FIG. 1 is a cross-sectional view of a substrate having a channel layer formed on and insulator in accordance with one embodiment.

In accordance with the present principles, an improved thin body semiconductor device with metallic source/drain (S/D) regions is provided. The source/drain region of the device is thickened to form raised source/drain (RSD) regions before a silicide process. The RSD provides a buffer layer to control metal diffusion towards the channel. A semiconductor reservoir is formed to ensure enough semiconductor material is present in forming an optimal silicide phase. The semiconductor reservoir prevents excessive metal diffusion into the channel to avoid forming a silicide pipe.

It should also be noted that, in some alternative implementations, the functions noted in a block in a block/flow diagram of the FIGs. may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture (e.g., a thin channel device on a semiconductor-on-insulator (SOI) wafer); however, other architectures, structures, substrate materials and process features and steps may be varied within the scope of the present invention.

Devices as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a structure 100 includes a channel layer 102, preferably a thin channel layer for forming a thin-channel device. Structure 100 may be a thin semiconductor-on-insulator (SOI) or includes a bulk substrate that may include Gallium Arsenide, monocrystalline silicon, Germanium, or any other material or combination of materials where the present principles may be applied. In some embodiments, the structure 100 further comprises other features or structures that are formed on or in the semiconductor substrate in previous process steps.

In one embodiment, the channel layer 102 is formed on or joined to a thin buried insulator 104 (e.g., thickness 10-50 nm), such as e.g., a buried oxide (BOX). A base layer, handle layer or substrate 106 preferably includes a semiconductor layer, which may include Gallium Arsenide, monocrystalline silicon, Germanium, or any other material or combination of materials. Device isolation (e.g., shallow trench isolation (STI) (not shown) may be formed to separate devices.

Figure 2:
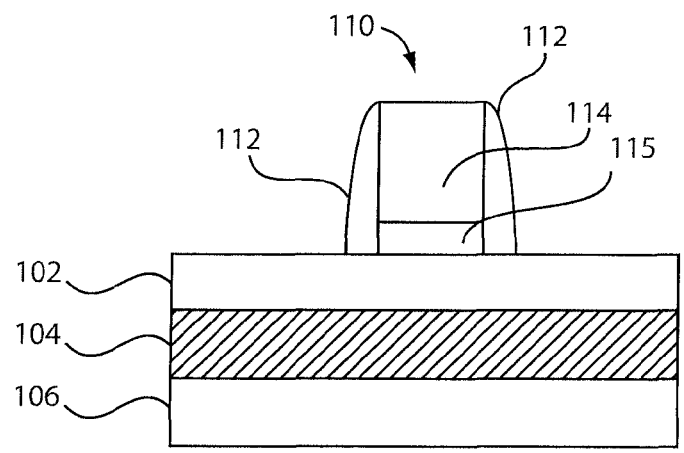
FIG. 2 is a cross-sectional view of the substrate of FIG. 1 having a gate structure formed on the channel layer in accordance with one embodiment.

Referring to FIG. 2, device processing is employed to form a gate structure 110. The gate structure 110 includes a gate conductor 114 and a gate dielectric 115, spacers 112 and an optional Source/Drain (S/D) extension doping in channel layer 102. The S/D extension doping occurs on opposite sides of the gate structure 110 and may extend to areas below the gate structure 110. In one embodiment, the spacers 112 may include SiN, the gate conductor 114 may include doped polysilicon, or a metal or metal alloy, e.g., copper, aluminum, tungsten, etc. The gate dielectric 115 may include a silicon oxide.

Figure 3:
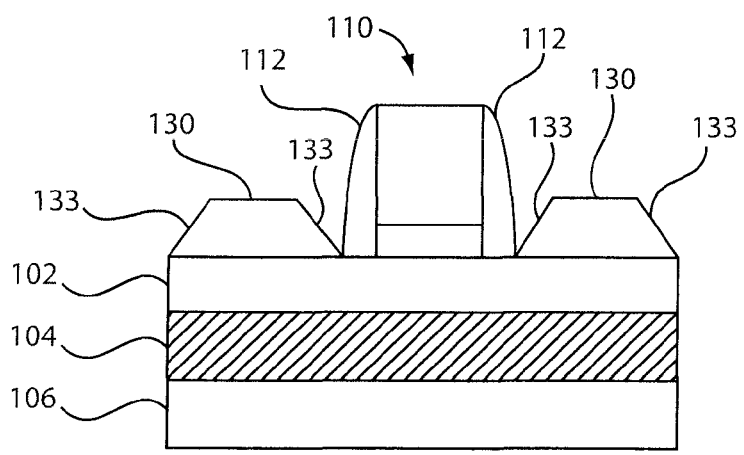
FIG. 3 is a cross-sectional view of the structure of FIG. 2 having raised reservoir material or raised source/drain regions (RSD) formed on the channel layer in accordance with one embodiment.

Referring to FIG. 3, an epitaxial structure, a raised source/drain layer (RSD) or a reservoir material 130 is formed on layer 102 in source/drain regions. This layer 130 can be grown with in-situ dopants present at the time of formation of the epitaxial grown layer 130, or the layer 130 can be implanted with dopant species after its initial deposition. Layer 130 may include a crystalline silicon material, silicon germanium, silicon carbide, in-situ boron doped silicon germanium, in-situ phosphorous doped silicon carbide, in-situ phosphorous doped silicon, in-situ arsenic doped silicon, in-situ phosphorous doped silicon germanium, etc. Layer 130 is implanted with dopants, which may include B, $BF_2$ or other p-type dopants for p-type devices and may include As, P or other n-type dopants for n-type devices. Layer 130 may include a faceted shape, straight edges or other geometrical configuration. At least one aspect in accordance with the present principles is that a raised semiconductor is intentionally faceted (133) or suitable shaped. The facet 133 enables the metal to take on a novel and advantageous structure after silicidation as will be explained.

In one embodiment, an annealing step is performed to drive in the dopants from the layer 130 to the channel layer 102 and form S/D extensions. Optionally, an implant can be done from the area between the facet 133 of layer 130 and the gate spacer 112 to form the extension or to control the diffusion of the dopants prior to the annealing step. This step may be implemented by forming a masking layer (not shown) to protect other areas of the device from the implantation. Optional halo implants may also be performed after the extension formation through a space between the facet 133 and the spacer 112. Depending on the method for forming the extensions, dopant densities of between about $1 \times 10^{19}/cm^3$ and $8 \times 10^{21}/cm^3$ are preferable. The halo implants are may include dopants such as B, $BF_2$, In, As, etc. having a density of between about $1 \times 10^{18}/cm^3$ and $5 \times 10^{20}/cm^3$.

Figure 4:
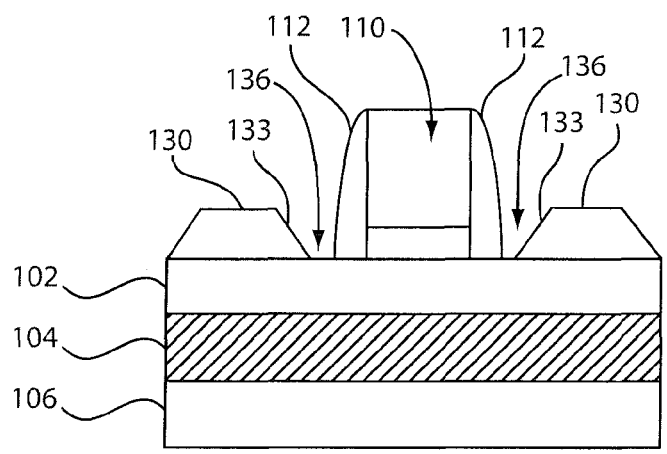
FIG. 4 is a cross-sectional view of the structure of FIG. 3 having the RSD etched back to open up a space between the RSD and the gate structure in accordance with one embodiment.

Referring to FIG. 4, in one embodiment, layer 130 is preferably grown by selective epitaxy. The layer can be grown with a faceted-type structure 133 by using consecutive cycles of deposition and etch of the semiconductor material. The structure 130 is etched as shown in FIG. 3 by using a standard photolithography process to block regions from being etched while allowing other regions to be completely removed., e.g., by an isotropic etch method. An etch mask may optionally be employed to protect areas where etching is not preferable. The facet 133 formed by the epitaxy process opens up space between spacers 112 and RSDs 130. In one embodiment, the etch may be employed to open up a gap 136 down to layer 102.

Figure 5:
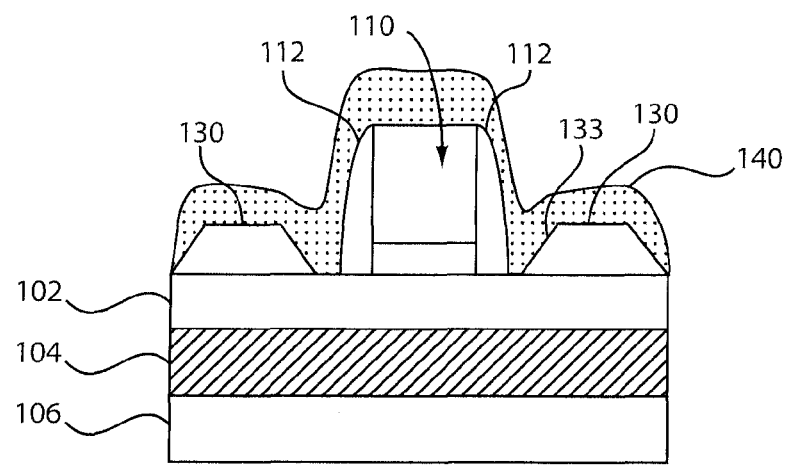
FIG. 5 is a cross-sectional view of the structure of FIG. 4 having a metal layer deposited on the RSD and in the space between the RSD and the gate structure in accordance with one embodiment.

Referring to FIG. 5, a metal layer 140 is deposited over a top surface of gate structure 110 and RSDs 130. The metal layer 140 preferably fills any space between spacers 112 and the RSDs 130. If a gap 136 is present, the gap 136 is filled down to layer 102. The metal layer 140 may include nickel, cobalt, titanium, tungsten, or other suitable metals or alloys thereof. The metal layer 140 may be deposited by chemical vapor deposition (CVD), a plasma enhanced CVD (PECVD), sputtering, physical vapor deposition, etc.

Figure 6:
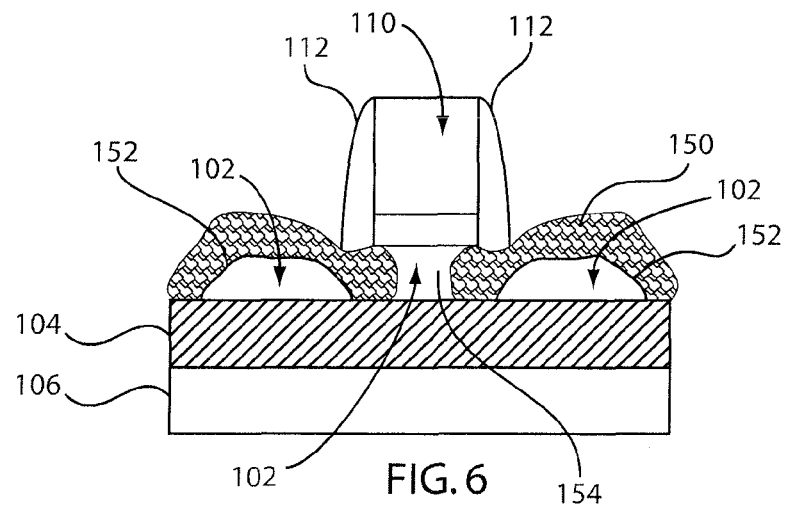
FIG. 6 is a cross-sectional view of the structure of FIG. 5 having a silicide formed which consumes at least a portion of the RSD and at least a portion of the channel layer to form a transistor in accordance with one embodiment.

Referring to FIG. 6 with continued reference to FIG. 5, the metal layer 140 is subjected to a silicide formation process, which in one example, includes diffusing a refractory metal (metal layer 140), such as Ni, Co, W, Ti, etc. that has been deposited on a silicon surface into the silicon to form a silicide layer 150 by a direct metallurgical reaction. The metal layer 140 is in contact with RSD 130 and possibly layer 102. Both the RSD 130 and layer 102 preferably include silicon. The uniquely shaped RSD 130 acts as a buffer or reservoir material that advantageously protects portions of the channel layer 102 from being silicided. The metal layer 140 is deposited on the silicon of the RSD 130 and/or layer 102 and takes on a novel profile in accordance with the shape of the RSD layer 130. The wafer or device is exposed to high temperatures (e.g., 500-1000 degrees C.) that promote the chemical reactions between the metal layer 140 and the silicon of RSD 130 and/or layer 102 to form the silicide 150. In the metallurgical reaction, metal-rich silicides form first, and continue to grow until all the metal is consumed. Silicide formation by direct metallurgical reaction consumes silicon from the substrate onto which the metal was placed. Enough silicon is made available to form the silicide layers by including RSD layers 130. The RSD 130 provides a template to control metal formation towards a channel 154 formed below the gate structure 110 and controls the form of the silicide (e.g., a mounded shape). A remaining portion of the channel layer and/or the reservoir material is labeled as material 152. Material 152 remains after ensuring enough semiconductor material is present in forming an optimal silicide phase (150). Having the remaining reservoir material 152 prevents excessive metal diffusion into the channel 154 to avoid forming a silicide pipe.

As shown in FIG. 6, the channel 154 is formed in an area below gate structure 110. The silicide 150 is formed in a controlled way as a result of the shape of the RSD 130 and the formation of a space or gap 136 between the spacers and the RSD 130. In this way, the silicide 150 may grow down to the insulator 104 and not grow so as to make contact with the silicide forming on the opposite side of the gate structure 110 (e.g., silicides 150 do not make contact below the gate structure 110). Processing continues in accordance with known techniques to form transistors, such as finFETs or other thin channel devices that may include a Schottky Barrier.

Figure 7:
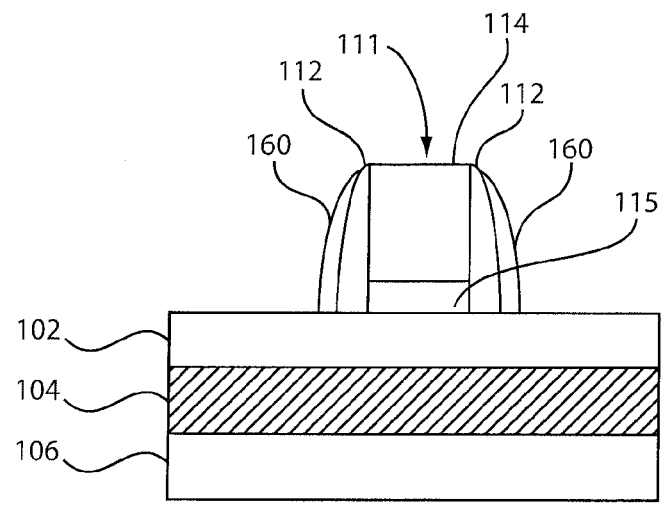
FIG. 7 is a cross-sectional view of the structure of FIG. 2 having an extra spacer formed on the gate structure in accordance with one embodiment.

Referring to FIG. 7, an alternate embodiment is illustratively described and shown, which provides a different way to form a space (or gap 136). Beginning with the structure shown in FIG. 2, a second set of spacers 160 are formed on spacers 112 of a gate structure 111. The spacers 160 are formed to save or create a space before the formation of RSD 130. Spacers 160 may include a silicon nitride, silicon dioxide or equivalent.

Figure 8:
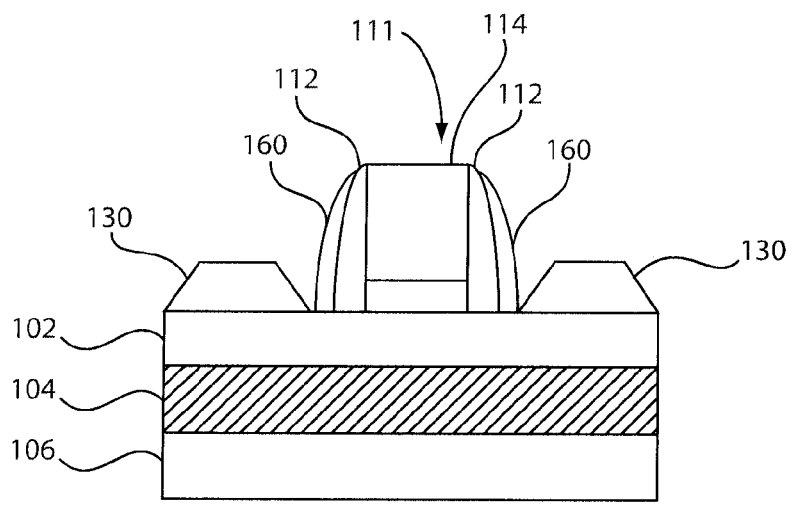
FIG. 8 is a cross-sectional view of the structure of FIG. 7 having the RSD formed adjacent to the extra spacer in accordance with one embodiment.

Referring to FIG. 8, the epitaxial structure or layer (RSD) 130 is formed on layer 102 in source/drain regions. This layer 130 is grown in contact with spacers 160. Spacers 160 provide a sufficient and predetermined amount of space between spacers 112 and RSD 130. The thickness of spacers 160 may be employed to control a shape and configuration of the later formed silicide layer by controlling a size of a space or gap 136, which in turn controls an amount of exposed surface area of RSD 130 and/or layer 102 when a metal is formed on these surfaces.

Figure 9:
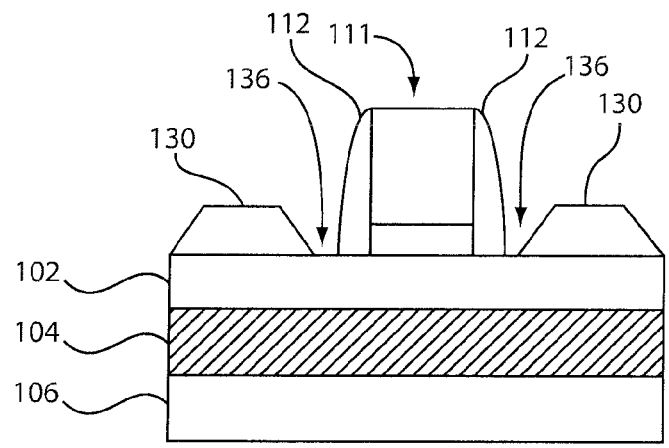
FIG. 9 is a cross-sectional view of the structure of FIG. 8 having the extra spacer removed to form a space between the RSD and the gate structure in accordance with one embodiment.

Referring to FIG. 9 with continued reference to FIG. 8, an etching process such as a wet or dry etch is performed to remove spacers 160 from spacers 112 and to leave a space or gap 136 between spacers 112 and RSD 130. A portion of layer 102 may be exposed as well. With the removal of spacer 160, the structure of FIG. 4 is essentially achieved and processing can continue as described with reference to FIGS. 5-6.

Figure 10:
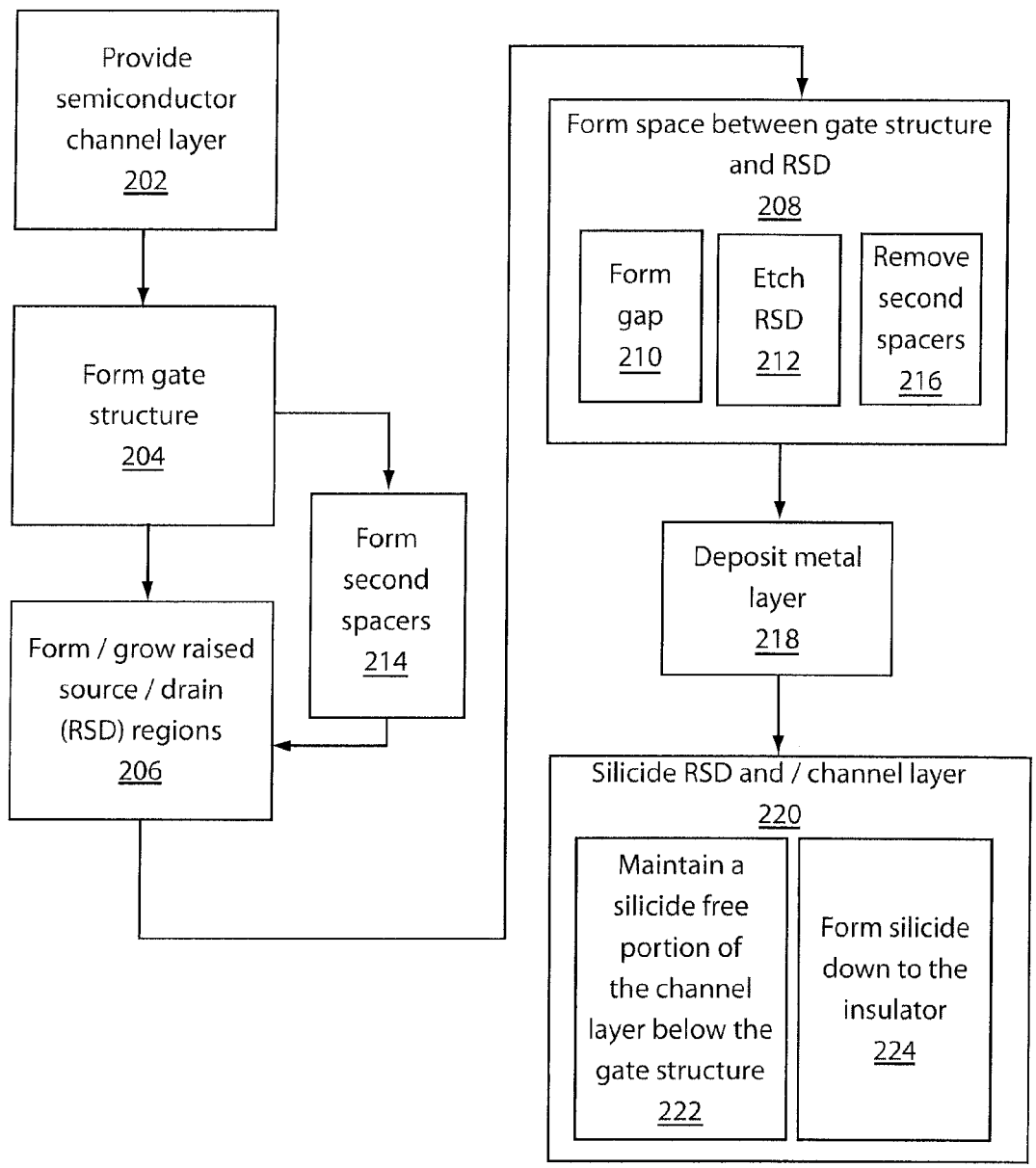
FIG. 10 is a block/flow diagram showing a method for fabricating a semiconductor device in accordance with an illustrative embodiment.

Referring to FIG. 10, a block/flow diagram shows an illustrative method for fabricating a semiconductor device, e.g., a thin channel semiconductor device, in accordance with the present principles. In block 202, a semiconductor substrate is provided and may include an insulator or other materials. In block 204, a gate structure is formed having first spacers on sidewalls. The gate structure includes gate dielectric, a gate conductor and may include one or more other features. A raised semiconductor region, raised source/drain region (RSD) or reservoir material is grown or formed on the substrate (e.g., channel layer) adjacent to the gate structure in a source/drain region in block 206. The raised semiconductor region may include epitaxially growing a faceted raised semiconductor region having a facet adjacent to the gate structure.

A space is formed between the raised semiconductor region and the gate structure in block 208. In one embodiment, this includes opening a gap between the raised semiconductor region and the gate structure to expose a portion of the substrate (e.g., channel layer) in block 210. The gap is a space that exposes the underlying layer (e.g., channel layer). In one embodiment, the space is formed between the raised semiconductor region and the gate structure by etching the raised semiconductor region and the gate structure in block 212. In another embodiment, the space is formed by forming second spacers on the first spacers before growing the raised semiconductor region in block 214, and removing the second spacers to form the space (or gap) in block 216.

A metal layer is deposited on at least the raised semiconductor region and within the space in block 218. The metal layer may include a refractory metal layer including, e.g., at least one of Ni, Co, Ti and W. In block 220, the raised semiconductor region(s) is silicided into the channel layer. The silicide may extend deeper into the channel layer at a position corresponding to the space or gap. The silicide forms source/drain regions adjacent to the gate structure. In one embodiment, siliciding the raised semiconductor region includes maintaining a portion of the channel layer below the gate structure that is free of silicide through a thickness of the channel layer in block 222. In another embodiment, siliciding the raised semiconductor region includes forming a silicide through the channel layer down to the insulator layer in block 224.

Having described preferred embodiments of a formation method and structure for a well-controlled metallic source/drain semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
  growing a raised semiconductor region on a channel layer adjacent to a gate structure;
  forming a space between the raised semiconductor region and the gate structure;
  depositing a metal layer on at least the raised semiconductor region; and
  siliciding the raised semiconductor region to form a silicide into the channel layer which extends deeper into the channel layer at a position corresponding to the space.

2. The method as recited in claim 1, wherein growing a raised semiconductor region includes epitaxially growing a faceted raised semiconductor region having a facet adjacent to the gate structure.

3. The method as recited in claim 1, wherein depositing a metal layer includes depositing a refractory metal layer including at least one of Ni, Co, Ti and W.

4. The method as recited in claim 1, wherein forming a space between the raised semiconductor region and the gate structure includes opening a gap between the raised semiconductor region and the gate structure to expose a portion of the channel layer.

5. The method as recited in claim 1, wherein forming a space between the raised semiconductor region and the gate structure includes etching the raised semiconductor region.

6. The method as recited in claim 1, wherein the gate structure includes first spacers on sidewalls thereof and forming a space between the raised semiconductor region and the gate structure includes:
   forming second spacers on the first spacers before growing the raised semiconductor region; and
   removing the second spacers to form the space.

7. The method as recited in claim 1, wherein siliciding the raised semiconductor region includes maintaining a portion of the channel layer below the gate structure that is free of silicide through a thickness of the channel layer.

8. The method as recited in claim 1, wherein the channel layer is formed on an insulator and siliciding the raised semiconductor region includes forming a silicide through the channel layer down to the insulator layer.

9. A method for forming a thin channel semiconductor device, comprising:
   providing a semiconductor channel layer on an insulator;
   forming a gate structure having first spacers formed on sidewalls thereof;
   growing a raised semiconductor region on the channel layer adjacent to a gate structure in a source/drain region;
   forming a space between the raised semiconductor region and the gate structure;
   depositing a metal layer on at least the raised semiconductor region and within the space; and
   siliciding the raised semiconductor region to form a silicide into the channel layer which extends deeper into the channel layer at a position corresponding to the space, the silicide forming source/drain regions adjacent to the gate structure.

10. The method as recited in claim 9, wherein growing a raised semiconductor region includes epitaxially growing a faceted raised semiconductor region having a facet adjacent to the gate structure.

11. The method as recited in claim 9, wherein depositing a metal layer includes depositing a refractory metal layer including at least one of Ni, Co, Ti and W.

12. The method as recited in claim 9, wherein forming a space between the raised semiconductor region and the gate structure includes opening a gap between the raised semiconductor region and the gate structure to expose a portion of the channel layer.

13. The method as recited in claim 9, wherein forming a space between the raised semiconductor region and the gate structure includes etching the raised semiconductor region.

14. The method as recited in claim 9, wherein forming a space between the raised semiconductor region and the gate structure includes:
   forming second spacers on the first spacers before growing the raised semiconductor region; and
   removing the second spacers to form the space.

15. The method as recited in claim 9, wherein siliciding the raised semiconductor region includes maintaining a portion of the channel layer below the gate structure that is free of silicide through a thickness of the channel layer.

16. The method as recited in claim 9, wherein siliciding the raised semiconductor region includes forming a silicide through the channel layer down to the insulator layer.

* * * * *